(12) United States Patent
Brunelli

(10) Patent No.: US 6,837,773 B2
(45) Date of Patent: Jan. 4, 2005

(54) METHOD AND APPARATUS FOR CONTROLLING A TEMPERATURE OF A POLISHING PAD USED IN PLANARIZING SUBSTRATES

(75) Inventor: Thad Lee Brunelli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/340,448

(22) Filed: Jan. 10, 2003

(65) Prior Publication Data

US 2003/0104769 A1 Jun. 5, 2003

Related U.S. Application Data

(63) Continuation of application No. 09/338,030, filed on Jun. 22, 1999, now Pat. No. 6,533,647, which is a continuation of application No. 08/993,256, filed on Dec. 18, 1997, now Pat. No. 5,957,750.

(51) Int. Cl.[7] ............................................. B24B 1/00
(52) U.S. Cl. ............................ 451/7; 451/21; 451/41; 451/56
(58) Field of Search ........................... 451/6, 7, 55, 56, 451/443, 488, 41, 285–289

(56) References Cited

U.S. PATENT DOCUMENTS

| | | |
|---|---|---|
| 2,662,519 A | 12/1953 | Metzger |
| 3,841,031 A | 10/1974 | Walsh |
| 4,450,652 A | 5/1984 | Walsh |
| 4,513,538 A | 4/1985 | Wolters et al. |
| 4,910,155 A | 3/1990 | Cote et al. |
| 5,081,051 A | 1/1992 | Mattingly et al. |
| 5,104,828 A | 4/1992 | Morimoto et al. |
| 5,127,196 A | 7/1992 | Morimoto et al. |
| 5,154,021 A | 10/1992 | Bombardier et al. |
| 5,193,316 A | 3/1993 | Olmstead |
| 5,216,843 A | 6/1993 | Breivogel et al. |
| 5,399,233 A | 3/1995 | Murazumi et al. |
| 5,456,627 A | 10/1995 | Jackson et al. |
| 5,478,435 A | 12/1995 | Murphy et al. |
| 5,486,129 A | 1/1996 | Sandhu et al. |

(List continued on next page.)

FOREIGN PATENT DOCUMENTS

| | | |
|---|---|---|
| EP | 3 66 027 | 5/1990 |
| JP | WO 9633842 | 10/1996 |

OTHER PUBLICATIONS

Li, Weidan et al., "The effect of the polishing pad treatments on the chemical–mechanical polishing of $SiO_2$ films," *Thin Solid Films*, 270, 1995, pp. 601–606.

*Primary Examiner*—George Nguyen
(74) *Attorney, Agent, or Firm*—Dorsey & Whitney LLP

(57) ABSTRACT

A method and apparatus for controlling a polishing characteristic of a polishing pad used in planarization of a substrate. The method preferably includes controlling the temperature of a planarizing surface of the polishing pad so that waste matter accumulations on the planarizing surface soften and/or become more soluble, and/or material comprising the planarizing surface attains approximately its glass transition temperature. The waste matter accumulations and/or a portion of the planarizing surface are in this way softened and more easily removed. The planarizing surface is either heated directly by directing a flow of heated planarizing liquid or heated air to the planarizing surface or indirectly by heating a support surface beneath the polishing pad or by heating the air proximate to the polishing pad.

14 Claims, 5 Drawing Sheets

U.S. PATENT DOCUMENTS

| | | |
|---|---|---|
| 5,486,131 A | 1/1996 | Cesna et al. |
| 5,578,529 A | 11/1996 | Mullins |
| 5,605,488 A | 2/1997 | Ohashi et al. |
| 5,607,718 A | 3/1997 | Sasaki et al. |
| 5,643,060 A | 7/1997 | Sandhu et al. |
| 5,643,067 A | 7/1997 | Katsuoka et al. |
| 5,664,987 A | 9/1997 | Renteln |
| 5,702,291 A | 12/1997 | Isobe |
| 5,716,264 A | 2/1998 | Kimura et al. |
| 5,725,417 A | 3/1998 | Robinson |
| 5,730,642 A | 3/1998 | Sandhu et al. |
| 5,749,772 A | 5/1998 | Shimokawa |
| 5,762,537 A | 6/1998 | Sandhu et al. |
| 5,957,750 A * | 9/1999 | Brunelli .................. 451/7 |
| 6,012,967 A | 1/2000 | Satake et al. |
| 6,533,647 B1 * | 3/2003 | Brunelli .................. 451/53 |

* cited by examiner

METHOD AND APPARATUS FOR CONTROLLING A TEMPERATURE OF A POLISHING PAD USED IN PLANARIZING SUBSTRATES

CROSS-REFERENCE TO RELATED APPLICATIONS

This application is a continuation of U.S. patent application Ser. No. 09/338,030, filed Jun. 22, 1999 now U.S. Pat. No. 6,533,647, which is a continuation of U.S. patent application Ser. No. 08/993,256, filed Dec. 18, 1997, issued Sep. 28, 1999, as U.S. Pat. No. 5,957,750.

TECHNICAL FIELD

The present invention relates to methods and apparatus for conditioning of polishing pads used in planarizing substrates.

BACKGROUND OF THE INVENTION

Chemical-mechanical planarization ("CMP") processes remove material from the surface of semiconductor wafers or other substrates in the production of microelectronic devices and other products. CMP processes typically planarize and/or polish the surface of the substrate in the fabrication of integrated circuits by moving the substrate across a polishing medium to remove material from the substrate surface.

FIG. 1 is a schematic view that illustrates a conventional CMP machine 10 with a platen 20, a wafer carrier 30, a polishing pad 40, and a planarizing liquid 44 on the polishing pad 40. The platen 20 is typically connected to a drive assembly 26 to rotate the platen 20 (indicated by arrow A) or reciprocate the platen 20 back and forth (indicated by arrow B). Additionally, the wafer carrier 30 generally has a lower surface 32 to which one or more wafers 12 may be attached, or the wafers 12 may be attached to resilient pads 34 positioned between the wafers and the lower surface 32. The wafer carrier 30 is generally attached to an actuator assembly 36 to impart axial and/or rotational motion to the wafers 12 (indicated by arrows C and D, respectively), or the wafer carrier 30 may be a weighted, free-floating wafer holder (not shown).

The polishing pad 40 and the planarizing liquid 44 may separately, or in combination, define a polishing medium that mechanically and/or chemically removes material from the surface of a wafer. The polishing pad 40 may be a conventional polishing pad made from a continuous phase matrix material (e.g., polyurethane), or it may be a new generation abrasive polishing pad made from abrasive particles fixedly dispersed in a suspension medium. Conversely, the planarizing liquid 44 may be a conventional CMP slurry with abrasive particles, or it may be a planarizing solution without abrasive particles. In general, abrasive slurries are used with conventional non-abrasive polishing pads and planarizing solutions are used with abrasive polishing pads.

To planarize the wafers 12 with the CMP machine 10, the wafer carrier 30 presses the wafers 12 face-downward against the polishing medium. More specifically, the wafer carrier 30 generally presses the wafers 12 against the planarizing liquid 44 on a planarizing surface 42 of the polishing pad 40, and at least one of the platen 20 or the wafer carrier 30 moves relative to the other to move the wafers 12 across the planarizing surface 42. As the wafers 12 move across the planarizing surface 42, material is removed from the face of the wafers. The process is conventionally conducted at platen temperatures of approximately 85° F. to 105° F. to facilitate any chemical interaction between the polishing medium and the wafer 12. Conventional wisdom is that processing at higher temperatures may cause undesirable chemical interactions between the polishing medium and the wafer 12. Furthermore, where ammonia-based slurries are used, higher temperatures may cause the ammonia to evaporate, creating undesirable odors and potentially shifting the pH of the slurry by an unacceptable amount.

In the competitive semiconductor industry, it is desirable to maximize the through-put of finished wafers and to produce a uniform, planar surface on each wafer. The through-put of CMP processing is a function of several factors, one of which is the rate at which the thickness of the wafer decreases as it is being planarized (the "polishing rate"). The polishing rate affects the through-put because the polishing period per wafer decreases with increasing polishing rates and it is easier to accurately endpoint CMP processing with a consistent polishing rate. Thus, it is desirable to have a high, consistent polishing rate.

One manufacturing concern with CMP processing is that the through-put may drop because the act of planarizing wafers alters the condition of the polishing pads. More specifically, slurry and particles from the wafer and pad build up on the planarizing surface of the polishing pad and form waste matter accumulations that may cover portions of the planarizing surface. The accumulations may take the form of a hard glaze coating on the planarizing surface which reduces contact between the wafer and the planarizing surface. The polishing rate accordingly changes during CMP processing, which may make it more difficult to quickly planarize a wafer or endpoint the CMP process. Thus, the waste matter accumulations may reduce the through-put of CMP processing.

CMP processes must also consistently and accurately produce a uniform, planar surface on the wafer because it is important to accurately focus the image of circuit patterns on the surface of the wafer. As the density of integrated circuits increases, it is often necessary to accurately focus the critical dimensions of the circuit pattern to within a tolerance of approximately 0.1 $\mu$m. Focusing circuit patterns to such small tolerances, however, is very difficult when the surface of the wafer is not uniformly planar. Thus, planarizing processes must create a highly uniform, planar surface.

Another problem with CNP processing is that the waste matter accumulations reduce the uniformity of the polishing rate across the planarizing surface of a polishing pad. The waste matter accumulations do not build up uniformly across the planarizing surface of the polishing pad, and thus the polishing rate may vary unpredictably across the polishing pad. As a result, the surface of a polished wafer may not be uniformly planar.

The problems associated with waste matter accumulations are exacerbated when the planarizing surface simultaneously planarizes a large number of wafers or when the planarization rate is increased. For example, FIG. 1 illustrates a single wafer carrier 30 to which are attached several wafers 12, each of which contributes waste matter accumulations to the planarizing surface. In other conventional CMP machines, multiple wafer carriers, each with multiple wafers, further increase the rate at which waste matter accumulates on the planarizing surface. As the number of wafers planarized by a given planarizing surface increases, the rate at which waste matter accumulates on the planarizing surface also increases, decreasing wafer through-put and wafer uniformity.

In light of the problems associated with waste matter accumulations on polishing pads, it is necessary to periodically remove the waste matter accumulations from the planarizing surfaces so that the polishing pads are brought back into a desired state for planarizing substrates ("conditioning"). For example, U.S. Pat. No. 5,456,627 issued to Jackson et al. discloses an apparatus for conditioning a rotating, circular polishing pad with a rotating end effector that has an abrasion disk in contact with a polishing surface of the pad. The end effector described in U.S. Pat. No. 5,456,627 moves along a radius of the polishing pad surface at a variable velocity to compensate for the linear velocity of the polishing pad surface. Additionally, U.S. Pat. No. 5,456,627 discloses maintaining a desired contact force between the end effector and the polishing pad surface with a closed feedback loop in which a load transducer generates a signal with an amplitude proportional to the applied force. A computer then uses the signal from the load transducer to operate an actuator that moves the end effector in a direction so that the output of the load transducer is substantially equal to the desired contact force.

Another conventional conditioning method and apparatus, which is disclosed in U.S. Pat. No. 5,081,051 issued to Mattingly et al., uses an elongated blade with a serrated edge that is engaged with a portion of a circular, rotating polishing pad. The blade disclosed in U.S. Pat. No. 5,081,051 is pressed against a polishing path on the planarizing surface of the polishing pad to scrape or cut grooves into the planarizing surface.

Conventional conditioning methods and devices, however, take time to condition the pad because they abrasively wear away or cut through waste matter accumulations which have formed a hardened glaze on the planarizing surface. Additionally, conventional conditioning methods and devices may result in a non-planar surface on the polishing pads. Therefore, it would be desirable to develop a method and apparatus that reduces the time required to condition the polishing pads and improves the quality of the conditioned pads.

SUMMARY OF THE INVENTION

The present invention is directed, in part, toward a method and apparatus for controlling a polishing characteristic of a polishing pad used in planarization of a substrate. In one embodiment of the method, the temperature of a planarizing surface of the polishing pad is controlled to be at least approximately 98% of a glass transition temperature of polishing pad material comprising the polishing pad. The method further comprises removing material from the planarizing surface. The method may further comprise removing a predetermined thickness of the polishing pad to further control the polishing characteristic of the polishing pad. In one embodiment of the invention, the temperature of the planarizing surface is controlled by electrically heating a support surface supporting the polishing pad. In an alternate embodiment, the planarization surface is positioned within an insulated enclosure and is heated by heating the air within the enclosure proximate to the planarizing surface. In further alternate embodiments of the invention, the planarizing surface is heated directly. In one such embodiment, heated air is directed toward the planarizing surface. In another such embodiment, a heated planarizing liquid is directed toward the planarizing surface. The heated planarizing liquid both heats the planarizing surface and the waste matter accumulations thereon and, in one embodiment, aids in chemically-mechanically planarizing the substrates.

DETAILED DESCRIPTION OF THE INVENTION

The present invention is a heated planarizing surface of a polishing pad for planarizing semiconductor wafers, base plates for field emission displays, and other related substrates. An important aspect of the invention is that the planarizing surface of the polishing pad is maintained at a predetermined temperature while the pad is conditioned. Thus, unlike unheated polishing pads, a glaze layer which forms on the pad during CMP processing may be softened and easily removed during conditioning to increase the uniformity of the conditioned pad and reduce the time required to condition the pad. FIGS. 2–5 illustrate various embodiments of heating methods and apparatus, and like reference numbers refer to like parts throughout the various figures.

Figure 1:
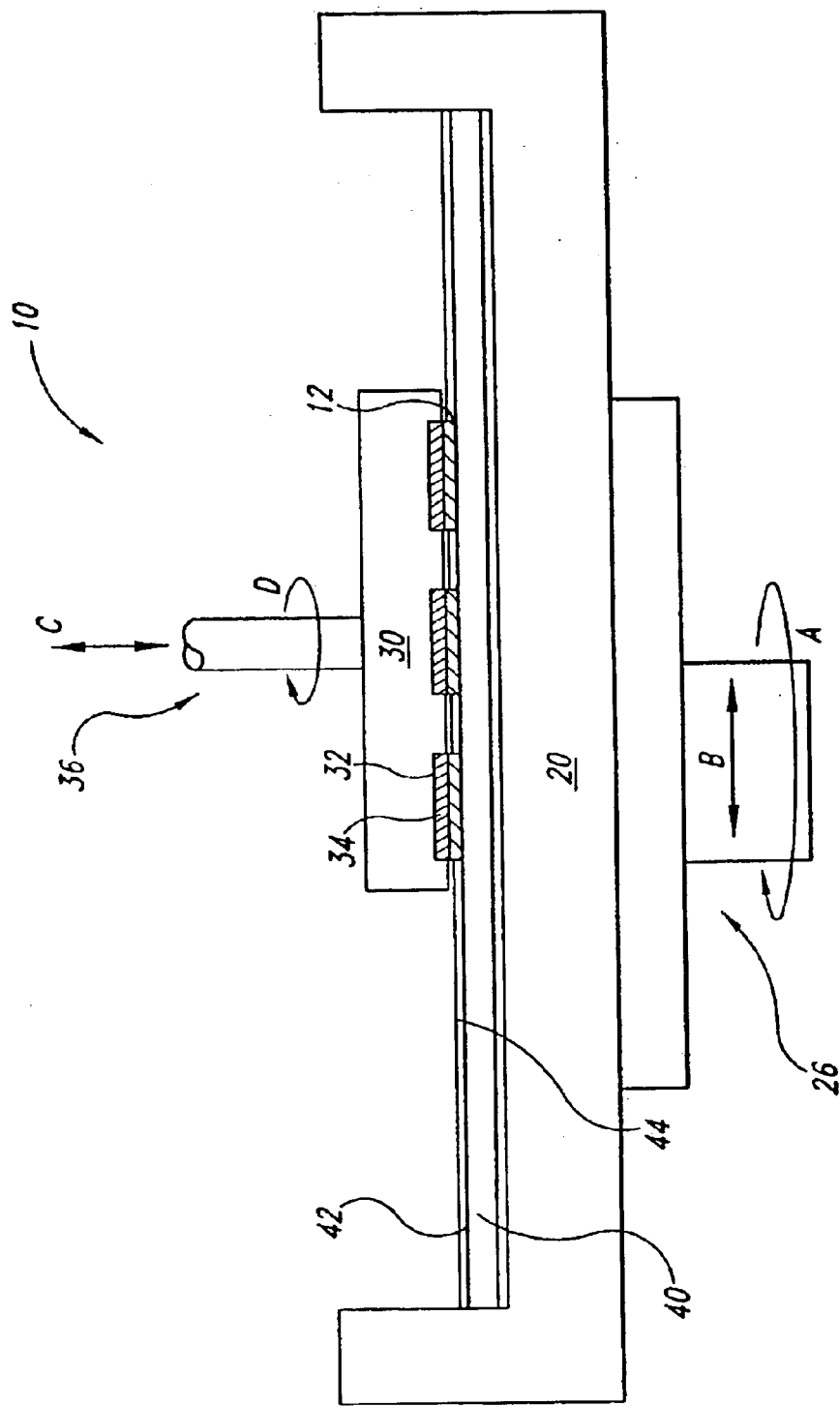
FIG. 1 is a partial cross-sectional view of a planarizing machine in accordance with the prior art.
Figure 2:
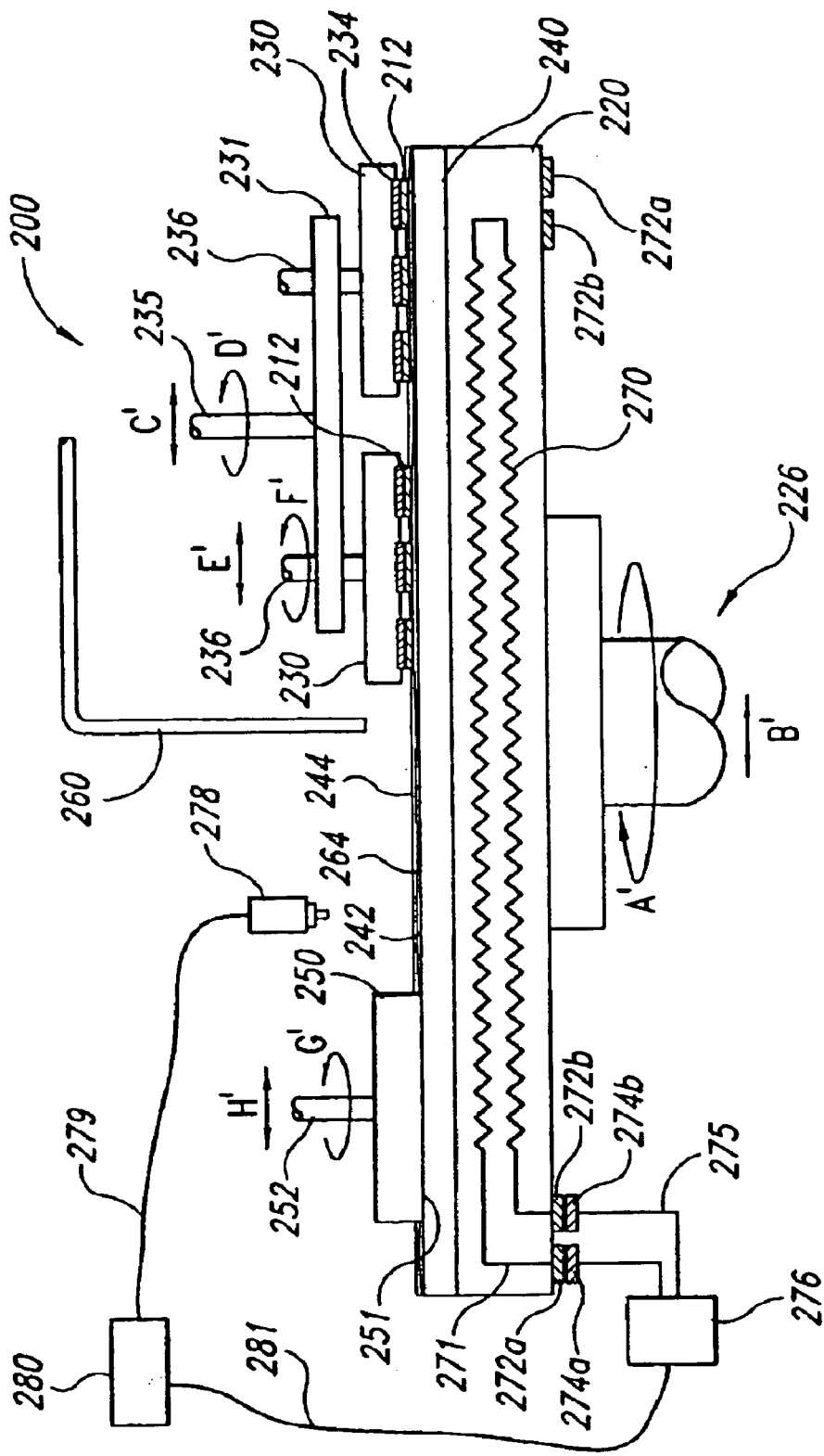
FIG. 2 is a partial cross-sectional view of an embodiment of a planarizing machine in accordance with the invention having a heated platen.

FIG. 2 is a partial cross-sectional view of a planarizing machine 200 in accordance with an embodiment of the present invention having a heated platen 220. The platen 220 supports a polishing pad 240 which has a planarizing surface 242 opposite the platen. The planarizing surface 242 engages wafers or other substrates 212. Material is removed from the substrates 212 by motion of the platen 220 and the substrates 212 relative to each other.

The substrates 212 are engaged and held in place against the planarizing surface 242 by a wafer carrier 230 and a resilient pad 234. In one embodiment, two wafer carriers 230 each engage three substrates 212, as shown in FIG. 2. In alternate embodiments, a greater or lesser number of wafer carriers 230 engages a greater or lesser number of substrates 212.

In one embodiment of the invention, the wafer carriers 230 each have carrier actuators 236 connected to a carrier manifold 231. The carrier actuators 236 may cause the wafer carriers 230 to reciprocate (indicated by arrow E') and/or rotate (indicated by arrow F') so as to generate a relative motion between the substrates 212 and the planarizing surface 242. The carrier manifold 231 is in turn connected to a manifold actuator 235. The manifold actuator causes the carrier manifold 231 to reciprocate (indicated by arrow C') and/or rotate (indicated by arrow D') so as to generate additional relative motion between the substrates 212 and the planarizing surface 242. The additional relative motion between the substrate 212 and the planarizing surface 242 increases the rate at which the substrate 212 is planarized. Further additional relative motion between the substrate 212 and the planarizing surface 242 may be generated by translating and/or rotating the platen 220 with a platen drive assembly 226 as indicated by arrows B' and A', respectively. Alternate embodiments of the planarizing machine 200 incorporate other arrangements for generating relative motion between the substrate 212 and the planarizing surface 242.

The planarizing rate of the substrates 212 may be further increased in the embodiment shown in FIG. 2 by adding a planarizing liquid 244 to the planarizing surface 242. As shown in FIG. 2, a liquid conduit 260 supplies the planarizing liquid 244 directly to the planarizing surface 242. The planarizing liquid 244 may be a planarizing solution having no additives, or it may be a slurry having abrasives and/or chemical agents that aid in mechanically and/or chemically removing material from the surfaces of the substrates 212. One such slurry includes an ammonia-based compound to increase the planarization rate. The planarizing liquid 244 has other compositions in other embodiments. The planarizing liquid 244 and the polishing pad 240 may separately or in combination define a polishing medium that mechanically and/or chemically removes material from the surface of the substrates 212 as the substrates move relative to the planarizing surface 242.

During planarization of the substrates 212, particles abraded from the substrate as well as other materials such as the planarizing liquid 244, form waste matter accumulations 264 which vary in thickness across the planarizing surface 242. Over time, the waste matter accumulations 264 tend to harden into a glaze layer which is interposed between the planarizing surface 242 and the substrates 212, reducing contact between the planarizing surface and the substrates, and therefore reducing the rate at which the planarizing surface planarizes the substrates. The rate at which the waste matter accumulations 264 form and harden is believed to be a function, in part, of (1) the relative velocity between the substrates 212 and the planarizing surface 242; (2) the number and size of substrates 212 in contact with the planarizing surface 242; and (3) the presence of soft doping materials such as polysilicon in the substrates 212.

To increase the through-put of finished substrates, it is desirable to increase the relative velocity between the substrates 212 and the planarizing surface 242, and to increase the number of substrates planarized at any one time. It is also desirable to planarize substrates 212 containing doping materials. However, as mentioned above, each of these processes tends to increase the rate at which waste matter accumulations 264 form on the planarizing surface 242 and decrease the planarizing rate of the substrates 212. Therefore, the glazed waste matter accumulations 264 are a significant problem in CMP processing.

To remove the waste matter accumulations 264 from the polishing pad 240 and restore the polishing characteristics and effectiveness of the planarizing surface 242, the polishing pad is conditioned with a conditioning disk 250, either concurrently with the planarization operation discussed above, or in a separate step. In one embodiment, the conditioning disk 250 has a conditioning surface 251 which contacts the planarizing surface 242 during conditioning. The conditioning disk 250 is connected to a conditioning disk actuator 252 which imparts a rotational and/or translational motion to the conditioning disk 250 (indicated by arrows G' and H', respectively) and causes the conditioning disk to move relative to the polishing pad 240. In this way, the conditioning surface 251 of the conditioning disk 250 abrades or cuts the waste matter accumulations 264 as it moves over the planarizing surface 242 and also removes a selected amount of material from the polishing pad 240.

In one embodiment in which the polishing pad 240 is a polyurethane-based IC-1000 pad manufactured by Rodel Corp. of Newark, N.J., the thickness of material removed from the polishing pad, not including the thickness of any waste matter accumulations 264, is in the range of approximately 0.00099 mm to approximately 0.003 mm per conditioning cycle. The planarizing characteristics of the polishing pad 240 are substantially restored by removing the waste matter accumulations 264 and a thickness of the pad material within the range indicated above. Other thicknesses of pad material may be removed from other types of polishing pads 240 during conditioning.

In one embodiment, the conditioning operation is expedited by supplying the planarizing liquid 244 to the planarizing surface 242 during conditioning. The planarizing liquid 244, which may be a slurry, augments the conditioning disk 250 by chemically, chemically etching, and/or mechanically removing material from the polishing pad 240.

To further increase the speed and uniformity with which waste matter accumulations 264 are removed from the planarizing surface 242, the planarizing surface is heated to a selected temperature with a temperature controller. In the embodiment shown in FIG. 2, the temperature controller comprises an electrical heating element 270 positioned within the platen 220. The platen 220 heats up when electrical current is passed through the heating element 270. By conduction, the heated platen 220 heats the polishing pad 240 and, in particular, the planarizing surface 242 of the polishing pad and the waste matter accumulations 264 on the planarizing surface. In an alternate embodiment, the heating element 270 is positioned within the polishing pad 240 itself to more directly heat the planarizing surface 242. In a further alternate embodiment, the heating element is positioned within the conditioning disk 250 to heat the planarizing surface 242.

The heating element 270 is electrically coupled to a power supply 276 which supplies electrical power thereto. In the embodiment shown in FIG. 2, the heating element 270 is connected with leads 271 to circular contact rings 272a and 272b which extend around the outer periphery of the platen 220. The contact rings 272a and 272b slideably engage contacts 274a and 274b, respectively, which are connected with electrical leads 275 to the power supply 276 in a conventional manner. When the platen 220 rotates, the contact rings 272a and 272b maintain engagement with the contacts 274a and 274b to continuously supply power to the heating element 270. In other embodiments, other devices may be used to supply power from the stationary power supply 276 to the movable heating element 270.

In one embodiment, the heating element 270 is actuated to heat the waste matter accumulations 264 to a selected temperature. At the selected temperature, the waste matter accumulations 264 soften and become less viscous and are therefore easier to remove from the planarizing surface 242. The waste matter accumulations 264 may also become more soluble in the planarizing liquid 244 at the selected temperature, further increasing the rate at which the waste matter accumulations may be removed from the planarizing surface 242. The effect has been observed for substrates which have been doped with soft doping materials such as polysilicon and is accordingly advantageous because the soft doping materials may be more likely than harder materials to form waste matter accumulations. Furthermore, the heating element may be actuated to heat the polishing pad 240 so that material comprising the polishing pad attains a temperature at the planarizing surface 242 which is believed to be approximately its glass transition temperature, causing the polishing pad material to soften and become easier to remove. Additionally, as the polishing pad material softens, it may become easier to remove the waste matter accumulations 264 therefrom.

In one embodiment, wherein the polishing pad 240 is an IC-1000 which comprises polyurethane and is manufactured by Rodel Corp. of Newark, N.J., the polishing pad material has a glass transition temperature of approximately 100° F. (311° K). The planarizing surface 242 is heated to a temperature in the range of approximately 90° F. (305° K) to approximately 115° F. (319° K) and preferably approximately 100° F. (311° K) to heat the polishing pad 240 and the waste matter accumulations 264 thereon. Accordingly, the planarizing surface 242 is heated to a temperature in the range of approximately 98% to approximately 103% of the glass transition temperature of the polishing pad material, as measured on an absolute temperature scale. In another embodiment, the platen 20 is heated to a temperature within the range of approximately 120° F. (322° K) to approximately 130° F. (328° K), which is well beyond the conventional platen heating range of 85° F. to 105° F. and which causes the planarizing surface 242 to be heated to a temperature in the range of approximately 90° F. to approximately 115° F. In further embodiments, other planarizing surface and/or platen temperatures are used, depending on the composition and heat transfer characteristics of the polishing pad 240, the platen 220, and the waste matter accumulations 264. For example, higher temperatures may be used where the polishing pad 240 is thermally less conductive or has a higher glass transition temperature.

In one embodiment, the temperature of the planarizing surface 242 is measured with a temperature sensor 278. The temperature sensor 278 may include an infrared sensor that directly measures the temperature of the planarizing surface 242, or may include other sensing devices known in the art. In one embodiment, a user may monitor the output of the temperature sensor 278 and manually control the temperature of the planarizing surface 242 to be within a desired range.

In an embodiment shown in FIG. 2, the temperature sensor 278 is coupled with a lead 279 to a thermostat 280. The thermostat 280 is in turn coupled to the power supply 276 with a lead 281 to automatically control power to the heating element 270 and establish the desired temperature at the planarizing surface 242 based on an input temperature received from the temperature sensor 278. The thermostat 280 may be set in a conventional manner to keep the planarization surface 242 at at least approximately 98% of its glass transition temperature and/or at a temperature at which the waste matter accumulations 264 soften and/or become more soluble. The thermostat setting may be adjusted depending upon the heat transfer characteristics of the platen 220, polishing pad 240 and/or waste matter accumulations 264.

Where conditioning occurs concurrently with planarization, as shown in FIG. 2, through-put is increased because the planarizing machine 200 may eliminate waste matter accumulations 264 as they form, and therefore the waste matter accumulations have a less substantial impact on the effectiveness of the polishing surface 242. In one embodiment, the waste matter accumulations 264 may not form at all, and the relative motion between the polishing pad 240 and the substrates 212 may be sufficient to condition the polishing pad, reducing or eliminating the need for the conditioning disk 250.

Where conditioning and planarization are sequential, the through-put may be increased by decreasing the amount of time required for conditioning and therefore decreasing the down-time of the planarizing machine 200. Where a slurry is used during conditioning, heating the planarizing surface 242 may soften the waste matter accumulations 264 and/or the polishing pad 240, thereby reducing the need for abrasive or chemically active slurries. Instead, de-ionized water, which does not contain expensive abrasive or chemical additives, may be used during conditioning resulting in additional cost savings.

A further advantage of the planarizing machine 200 is that by removing waste matter accumulations 264 quickly, the effect of any non-uniformities in the thickness of the waste matter accumulations is reduced. This is particularly so where conditioning and planarization are simultaneous because the waste matter has less time to form significant accumulations and therefore less time to become non-uniform.

Figure 3:
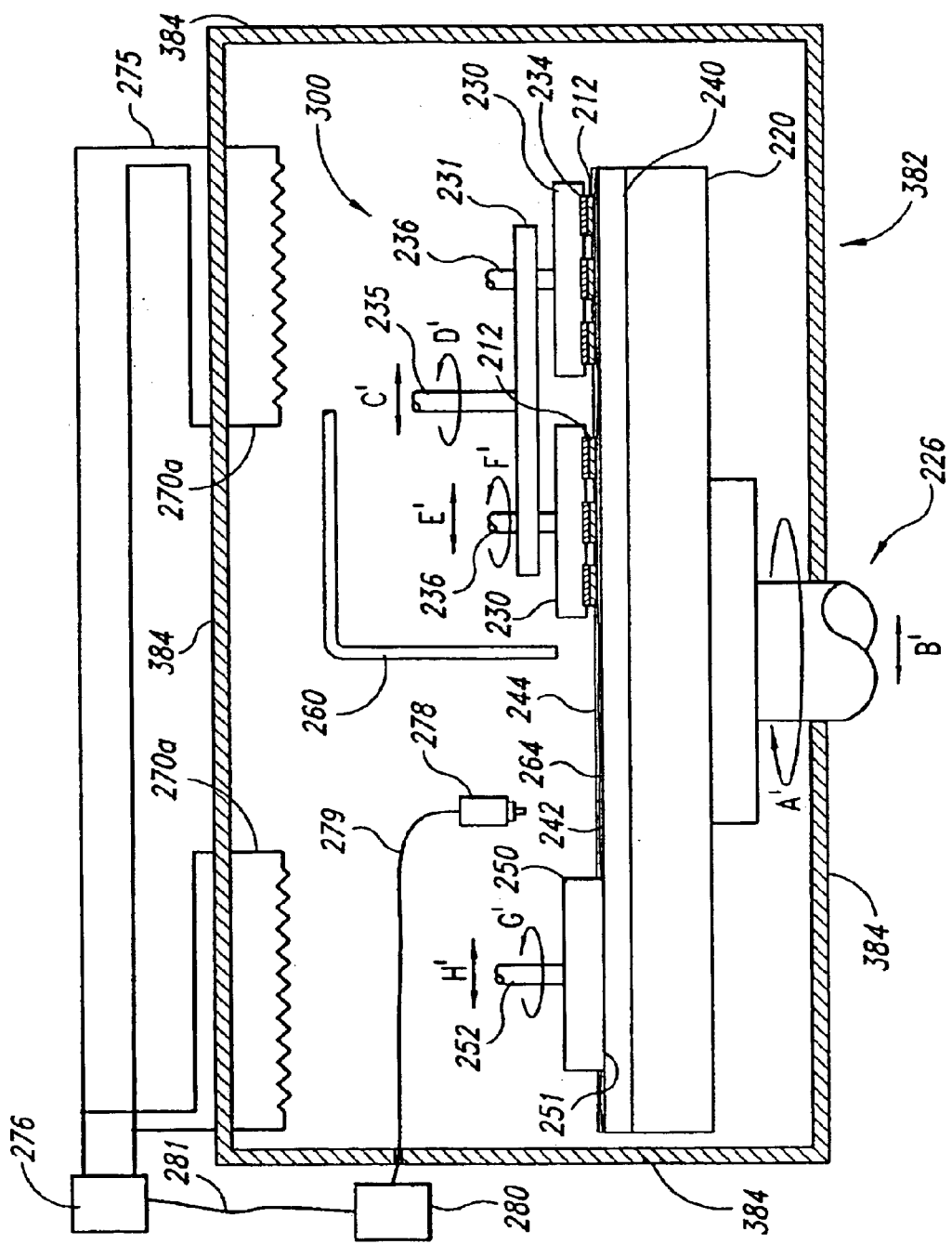
FIG. 3 is a partial cross-sectional view of another embodiment of a planarizing machine in accordance with the invention having a heated, insulated enclosure.

FIG. 3 is a partial cross-sectional view of another embodiment of a planarizing machine 300 housed in an insulated enclosure 382. The insulated enclosure 382 substantially surrounds the platen 220, the polishing pad 240, and the substrates 212 so as to minimize the heat transfer away from these components. Walls 384 of the insulated enclosure 382 are preferably formed from a material having a low thermal conductivity so that the temperature within the insulated enclosure may be easily regulated.

The temperature within the insulated enclosure 382 is regulated by a temperature controller comprising electrical heating elements 270a, as shown in FIG. 3. In a preferred embodiment, a plurality of heating elements 270a may be used to uniformly heat the environment within the insulated enclosure 382, as shown in FIG. 3. In an alternate embodiment (not shown), a single heating element 270a may be centrally positioned within the insulated enclosure 382 or may extend around the periphery of the insulated enclosure to heat the interior of the insulated enclosure 382. In further alternate embodiments, means other than electrical heating elements may be used to regulate the temperature within the insulated enclosure 382.

The heating elements 270a are capable of heating the environment within the insulated enclosure 382 and in particular, the planarizing surface 242, to the point at which the waste matter accumulations 264 soften and/or become more soluble, and/or the material comprising the polishing pad 240 attains a temperature approximately equal to at least 98% of its glass transition temperature. The heating elements 270a are therefore preferably positioned as close as possible to the planarizing surface 242 without overheating other components within the insulated enclosure 382 and without heating the planarizing surface non-uniformly or interfering with the planarization operation.

The heating elements 270a are coupled with the leads 275 to the electrical power supply 276 in a conventional manner. In a preferred embodiment, the heating elements 270a are automatically controlled by the thermostat 280 which receives inputs from the temperature sensor 278, in substantially the same manner as discussed previously with reference to FIG. 2. In this way, the temperature of the planarizing surface 242 may be controlled to be within the range of approximately 90° F.–115° F. in one embodiment. As discussed previously with reference to FIG. 2, other temperature ranges may be used for other embodiments having different compositions of polishing pads 240 and/or waste matter accumulations 264.

In one embodiment, the temperature sensor 278 may directly measure the temperature of the planarizing surface 242. In another embodiment, the temperature sensor 278 may measure other temperatures, such as the air temperature within the enclosure 384, which are associated with corresponding planarizing surface temperatures.

An advantage of the insulated enclosure 382 shown in FIG. 3, as compared with the heated platen 220 shown in FIG. 2, is that the insulated enclosure does not require an electrical coupling between a movable heating element and a fixed power supply. This heated enclosure 382 is therefore less susceptible to mechanical failure during normal operation and is less likely to require maintenance or replacement. A further advantage of the insulated enclosure 382 shown in FIG. 3 is that the enclosure is a simple and therefore low-cost construction and the components that comprise the enclosure are easily available.

Figure 4:
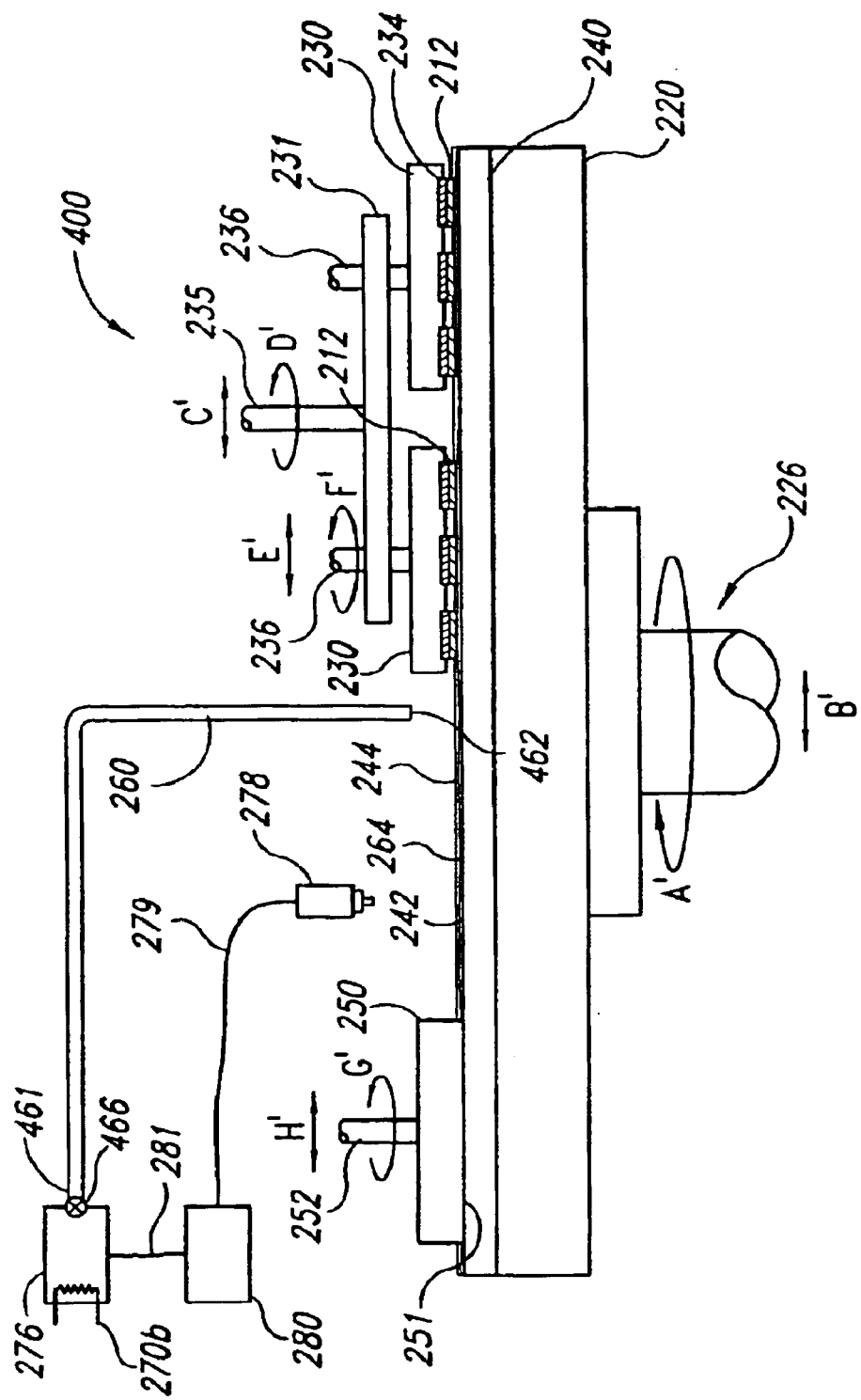
FIG. 4 is a partial cross-sectional view of another embodiment of a planarizing machine in accordance with the invention in which a flow of heated planarizing liquid is directed toward a planarizing surface of a polishing pad.

FIG. 4 is a partial cross-sectional view of another embodiment of a planarizing machine 400 having a flow of heated planarizing liquid 244 directed toward the planarizing surface 242 to control the temperature thereof. The liquid conduit 260 has a conduit inlet 461 coupled to a supply vessel 476 containing heated planarizing liquid. A conduit nozzle 462 is positioned above the planarizing surface 242 to direct the planarizing liquid 244 onto the planarizing surface, heating the surface. The temperature of the planarizing liquid 244 is regulated to heat the waste matter accumulations 264 on the planarizing surface 242 to the point at which they soften and/or become more soluble in the planarizing liquid 244, and/or to heat the material comprising the polishing pad 240 to at least approximately 98% of its glass transition temperature. In this way, the waste matter accumulations 264 and/or pad material are more easily removed to condition the planarizing surface 242. As discussed previously with reference to FIGS. 2–3, the planarizing surface 242 may be heated to a temperature within the range of approximately 90° F. to 115° F., in one embodiment, and other temperature ranges are used in other embodiments, depending upon the composition of the waste matter accumulations 264 and/or the polishing pad 240.

In one embodiment, the temperature of the planarizing surface is regulated automatically with the thermostat 280. The thermostat 280 receives an input temperature signal from the temperature sensor 278 and controls the supply of planarizing liquid 244 delivered to the planarizing surface 242 based on the difference, if any, between the input temperature and the desired planarizing surface temperature. In one embodiment, the thermostat 280 controls the temperature of planarizing liquid 244 by activating or deactivating a heat source 270b which heats the planarizing liquid in the supply vessel 476. In another embodiment, the thermostat 280 controls the amount of planarizing liquid 244 delivered to the planarizing surface 242 by opening or closing a valve 466 positioned in the liquid conduit 260.

In the embodiment shown in FIG. 4. a single liquid conduit 260 delivers the planarizing fluid 244 to the planarizing surface 242 through a single nozzle 462. In alternate embodiments (not shown), a plurality of liquid conduits 260 or a liquid conduit having a plurality of nozzles 462 may be used to more uniformly deliver planarizing liquid 244 to the planarizing surface 242. In this way, the temperature of the planarizing surface 242 and the waste matter accumulations 464 thereon may be more uniformly elevated and controlled. In a further alternate embodiment, the polishing pad 240 may be thermally insulated from the platen 220 so as to reduce heat transfer away from the polishing pad which might otherwise lower the temperature of the planarizing surface 242.

An advantage of the embodiment of the CMP machine shown in FIG. 4 is that the planarizing surface 242 is heated directly. In this way, the amount of energy required to heat the waste matter accumulations 264 and/or the planarizing surface 242 is reduced when compared to heating the platen 220 (FIG. 2) or the environment surrounding the platen (FIG. 3). Another advantage is that by heating the planarizing surface 240 directly, other components of the planarizing machine are not incidentally heated and are therefore less likely to fail as a result of exposure to elevated temperatures. Yet another advantage of directly heating the planarizing surface 242 is that the temperature of the planarizing surface can be quickly changed because heating is confined to the polishing pad. Rapid heating is advantageous particularly if the planarizing surface is permitted to cool between conditioning operations, because the time required to heat the planarizing surface 242 prior to conditioning is reduced. A further advantage of the embodiment shown in FIG. 4 is that the liquid conduit 260 is an existing element of typical CMP machines. Therefore, the effort and expense required to retrofit existing CMP machines with the capacity to elevate the temperature of the polishing pad material and/or the waste matter accumulations 264 thereon is reduced.

Figure 5:
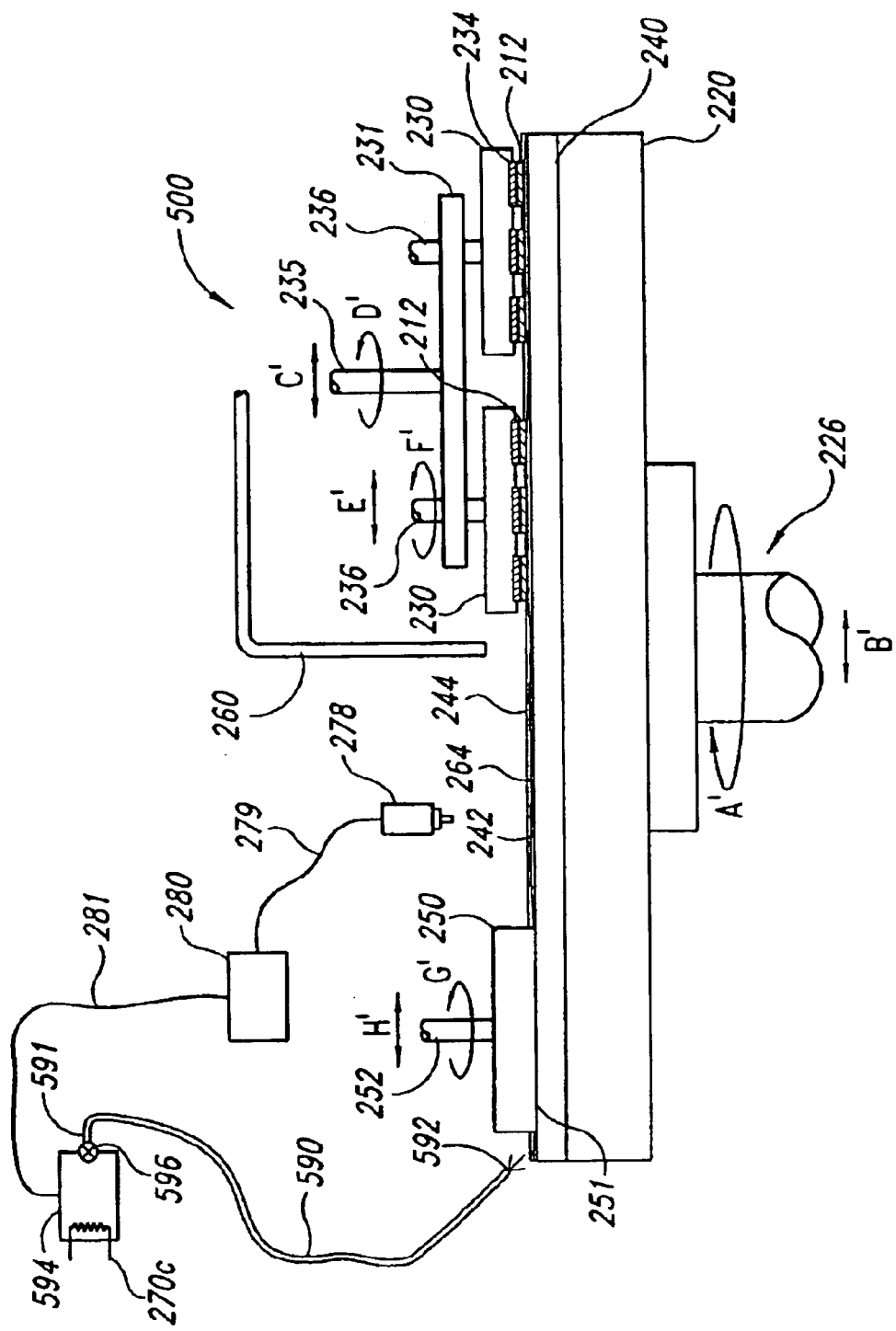
FIG. 5 is a partial cross-sectional view of another embodiment of a planarizing machine in accordance with the invention in which a flow of heated air is directed toward a planarizing surface of a polishing pad.

FIG. 5 is a partial cross-sectional view of another embodiment of a planarizing machine 500 in accordance with the invention having a gas conduit 590 positioned to direct a flow of heated gas, such as air, toward the planarizing surface 242 to control the temperature thereof. The gas conduit 590 is connected at one end 591 to a heated gas source 594. A nozzle 592 at an opposite end of the gas conduit 590 directs the flow of heated gas toward the planarizing surface, heating the planarizing surface 242 and the waste matter accumulations 264 to at least 98% of the glass transition temperature of the pad material. At this point, the waste matter accumulations 264 and/or pad materials soften and become easier to remove, reducing the amount of time required to condition the polishing pad 240, as discussed previously with reference to FIGS. 2–4.

As discussed previously with reference to FIGS. 2–4, the temperature of the planarizing surface 242 may be regulated automatically with the thermostat 280. The thermostat 280 receives an input temperature signal from the temperature sensor 278 and adjusts the flow of gas delivered to the planarizing surface based on any difference between the input temperature and the desired planarizing surface temperature. In one embodiment, the thermostat 280 regulates the temperature of the gas flow by activating or deactivating a heating source 270c which heats the gas in the gas source 594. In another embodiment, the thermostat 280 controls the amount of gas delivered to the planarizing surface 242 by opening or closing a valve 596 positioned in the gas conduit 590.

In one embodiment a single gas conduit 590 delivers heated gas to a single nozzle 591, as shown in FIG. 5. In alternate embodiments (not shown), a plurality of nozzles 591 coupled to a single gas conduit 590 or coupled to a plurality of gas conduits direct heated gas to different portions of the planarizing surface 242, uniformly heating the planarizing surface and the waste matter accumulations 264 thereon. In a preferred embodiment, the gas comprises air, though in alternate embodiments, other gases may be employed to heat the planarizing surface 242.

An advantage of the gas conduit 590 shown in FIG. 5 is that the planarizing surface 242 and the waste matter accumulations 264 thereon are heated directly, reducing the time and energy required to heat the planarizing surface and the waste matter accumulations 264, as discussed with reference to the liquid conduit 260 of FIG. 4. An advantage of the gas conduit 590 when compared with the liquid conduit 260 is that the gas conduit 590 allows a user to control the temperature of the planarizing surface 242 independent of the amount of planarizing liquid 244 delivered to the planarizing surface. This is advantageous because it allows the user to change the rate at which the planarizing liquid 244 is delivered to the planarizing surface 242 without substantially changing the temperature of the planarizing surface. In this way, the planarizing liquid delivery rate can be reduced, for example to accommodate a reduced number of substrates 212, without inadvertently allowing the temperature of the planarizing surface 242 to drop below a temperature at which the waste matter accumulations 264 soften and/or become more soluble in the planarizing liquid, and/or a temperature which is approximately the glass transition temperature of material comprising the polishing pad 240. Such a temperature drop may cause the waste matter accumulations 264 to harden, making the polishing pad 240 more difficult to condition and reducing the ability of the pad to planarize the substrates 212 effectively.

From the foregoing it will be appreciated that, although specific embodiments of the invention have been described herein for purposes of illustration, various modifications may be made without deviating from the spirit and scope of the invention. Accordingly, the invention is not limited except by the appended claims.

I claim:

1. A method of controlling a selected temperature of a planarizing surface of a polishing pad used in planarization of a substrate, comprising controlling the selected temperature of the planarizing surface to be at least approximately 98% of a glass transition temperature of the polishing pad material in the polishing pad by electrically heating a support surface supporting the polishing pad.

2. The method of claim 1 wherein the act of electrically heating a support surface supporting the polishing pad includes the act of heating the support surface under a polyurethane pad with a glass transition temperature of approximately 311.deg. K.

3. The method of claim 1 wherein the act of controlling a selected temperature of the planarizing surface includes the act of elevating the temperature of the planarizing surface to be within the range of approximately 305.deg. K. to about 319.deg. K.

4. A method of controlling a selected temperature of a planarizing surface of a polishing pad used in planarization of a substrate, comprising controlling the selected temperature of the planarizing surface to be at least approximately 98% of a glass transition temperature of the polishing pad material in the polishing pad by controlling an air temperature of air proximate to the planarizing surface.

5. The method of claim 4 wherein the act of controlling the air temperature of air proximate to the planarizing surface includes the act of controlling the air temperature of air proximate to a polyurethane pad with a glass transition temperature of approximately 311.deg. K.

6. The method of claim 5 wherein the act of controlling a selected temperature of the planarizing surface includes the act of elevating the temperature of the planarizing surface to be within the range of approximately 305.deg. K. to about 319.deg. K.

7. A method of controlling a selected temperature of a planarizing surface of a polishing pad used in planarization of a substrate, comprising controlling a temperature of a support surface supporting the planarizing surface to be within the range of about 322.deg. K. to about 328.deg. K. by electrically heating a support surface supporting the polishing pad.

8. The method of claim 7 wherein the act of controlling a temperature of a support surface includes controlling the temperature of a support surface supporting a polyurethane pad having a glass transition temperature of approximately 311.deg. K.

9. The method of claim 8 wherein the act of controlling a temperature of a support surface includes elevating the temperature of the planarizing surface to be within the range of approximately 305.deg. K. to about 319.deg. K.

10. The method of claim 8 wherein the act of controlling a temperature of a support surface includes elevating the temperature of the planarizing surface to be at least approximately 98% of a glass transition temperature of a polishing pad material in the polishing pad.

11. A method of controlling a selected temperature of a planarizing surface of a polishing pad used in planarization of a substrate, comprising controlling a temperature of the planarizing surface to be at least approximately 98% of a glass transition temperature of the polishing pad material in the polishing pad by electrically heating the polishing pad.

12. The method of claim 11 wherein the act of electrically heating the polishing pad includes the act of heating a polyurethane pad with a glass transition temperature of approximately 311.deg. K.

13. The method of claim 12 wherein the act of controlling a selected temperature of the planarizing surface includes the act of elevating the temperature of the planarizing surface to be within the range of approximately 305.deg. K. to about 319.deg. K.

14. A method of controlling a selected temperature of a planarizing surface of a polishing pad used in planarization of a substrate, comprising controlling a temperature of the planarizing surface to be at least approximately 98% of a glass transition temperature of the polishing pad material in the polishing pad by controlling a temperature of a conditioning disk positioned adjacent the planarizing surface and movable relative to the planarizing surface.

* * * * *

UNITED STATES PATENT AND TRADEMARK OFFICE
CERTIFICATE OF CORRECTION

PATENT NO. : 6,837,773 B2
APPLICATION NO. : 10/340448
DATED : January 4, 2005
INVENTOR(S) : Thad Lee Brunelli It is certified that error appears in the above-identified patent and that said Letters Patent is hereby corrected as shown below:

| Column, Line | Reads | Should Read |
|---|---|---|
| Column 4 Line 44 | "engages a greater" | --engage a greater-- |
| Column 9 Line 29 | "to 115° F., in one" | --to 115° F. in one-- |
| Column 12, Line 51 | [Omitted claims] | --15. The method of claim 14 wherein the act of controlling the selected temperature of the planarizing surface of the polishing pad includes the act of controlling the temperature of a polyurethane pad with a glass transition temperature of approximately 311.deg. K. 16. The method of claim 14 wherein the act of controlling a selected temperature of the planarizing surface includes the act of elevating the temperature of the planarizing surface to be within the range |

UNITED STATES PATENT AND TRADEMARK OFFICE
CERTIFICATE OF CORRECTION

PATENT NO. : 6,837,773 B2
APPLICATION NO. : 10/340448
DATED : January 4, 2005
INVENTOR(S) : Thad Lee Brunelli It is certified that error appears in the above-identified patent and that said Letters Patent is hereby corrected as shown below:

Column 12, Line 51 (con't)

of approximately 305.deg. K. to about 319.deg. K.--

Signed and Sealed this

Sixteenth Day of January, 2007

JON W. DUDAS
*Director of the United States Patent and Trademark Office*